United States Patent
Grimes et al.

(10) Patent No.: US 9,711,670 B2
(45) Date of Patent: Jul. 18, 2017

(54) SELF-CHARGING ELECTRONIC DEVICES

(71) Applicants: Craig Grimes, Philadelphia, PA (US); Kevin Kreisler, Philadelphia, PA (US)

(72) Inventors: Craig Grimes, Philadelphia, PA (US); Kevin Kreisler, Philadelphia, PA (US)

(73) Assignee: FLUXPHOTON CORPORATION, Superior, CO (US)

(*) Notice: Subject to any disclaimer, the term of this patent is extended or adjusted under 35 U.S.C. 154(b) by 432 days.

(21) Appl. No.: 14/016,563

(22) Filed: Sep. 3, 2013

(65) Prior Publication Data

US 2014/0097786 A1 Apr. 10, 2014

Related U.S. Application Data

(63) Continuation of application No. 13/590,786, filed on Aug. 21, 2012, now Pat. No. 8,835,285.

(Continued)

(51) Int. Cl.
*H02J 7/00* (2006.01)
*H02J 7/14* (2006.01)
(Continued)

(52) U.S. Cl.
CPC .. *H01L 31/0406* (2013.01); *H01L 31/035218* (2013.01); *H01L 31/035227* (2013.01);
(Continued)

(58) Field of Classification Search
USPC ....... 320/101, 134, 136, 135, 107, 108, 113, 320/114, 111; 136/253, 244, 201, 205,
(Continued)

(56) References Cited

U.S. PATENT DOCUMENTS 5,593,509 A * 1/1997 Zuppero ............... H02S 10/30
 136/253
5,969,435 A * 10/1999 Wilhelm ............... H02J 1/06
 307/64

(Continued)

OTHER PUBLICATIONS

International Search Report dated Feb. 6, 2014, issued in International Patent Application No. PCT/US2013/057801 which is the corresponding international application of the present application.

(Continued)

*Primary Examiner* — Alexis A Boateng
(74) *Attorney, Agent, or Firm* — Porzio, Bromberg & Newman P.C.

(57) ABSTRACT

Self-powered portable electronic devices are disclosed that have the capacity to generate their own electrical power, store electrical charge, and distribute electrical power to similarly designed devices in close proximity. Devices generate power in part using one or more non-solar thermal energy sources that have increased stability and efficiency compared to current solar cell powered devices. Devices comprise components including, control processors, data storage, energy storage, dedicated energy and power management processors, and thermophotovoltaic cells that convert thermal energy into electrical power. Devices are capable of transmitting and receiving energy, power, voice and data information using standard frequencies associated with portable devices. Additionally, the invention discloses methods, systems, and apparatuses comprising circuitry that can control power generation from multiple thermophotovoltaic cells and traditional power sources.

7 Claims, 5 Drawing Sheets

Related U.S. Application Data

(60) Provisional application No. 61/695,485, filed on Aug. 31, 2012, provisional application No. 61/792,783, filed on Mar. 15, 2013.

(51) Int. Cl.
*H01L 31/04* (2014.01)
*H02S 10/30* (2014.01)
*H02J 7/35* (2006.01)
*H01L 31/0352* (2006.01)
*H01M 10/46* (2006.01)

(52) U.S. Cl.
CPC .............. *H02J 7/0052* (2013.01); *H02J 7/35* (2013.01); *H02S 10/30* (2014.12); *H01M 10/46* (2013.01); *H02J 2007/0059* (2013.01)

(58) Field of Classification Search
USPC .................................. 136/206, 245, 246, 251
See application file for complete search history.

(56) References Cited

U.S. PATENT DOCUMENTS

| | | | |
|---|---|---|---|
| 6,057,507 A | 5/2000 | Fraas et al. | |
| 7,514,900 B2* | 4/2009 | Sander | H02J 7/008 320/101 |
| 7,868,582 B2 | 1/2011 | Sander et al. | |
| 8,217,619 B2 | 7/2012 | Sander et al. | |
| 9,041,354 B2* | 5/2015 | Lee | H02J 7/35 307/25 |
| 2003/0128010 A1* | 7/2003 | Hsu | H02J 7/355 320/101 |
| 2004/0142733 A1* | 7/2004 | Parise | B01F 5/0614 455/572 |
| 2005/0052165 A1 | 3/2005 | Willner et al. | |
| 2005/0121069 A1* | 6/2005 | Chou | H01L 31/02167 136/253 |
| 2009/0101194 A1 | 4/2009 | Kare | |
| 2009/0160396 A1* | 6/2009 | Shyu | H01M 14/005 320/101 |
| 2011/0080135 A1* | 4/2011 | Bland | H02J 17/00 320/101 |
| 2012/0098350 A1* | 4/2012 | Campanella | B60L 3/0069 307/104 |
| 2012/0098478 A1* | 4/2012 | Rich | H01M 10/46 320/101 |
| 2015/0041598 A1* | 2/2015 | Nugent | H02J 17/00 244/53 R |

OTHER PUBLICATIONS

International Preliminary Report on Patentability and Written Opinion dated Mar. 3, 2015, issued in International Patent Application No. PCT/US2013/057801 which is the corresponding international application of the present application.

* cited by examiner

FIG. 5
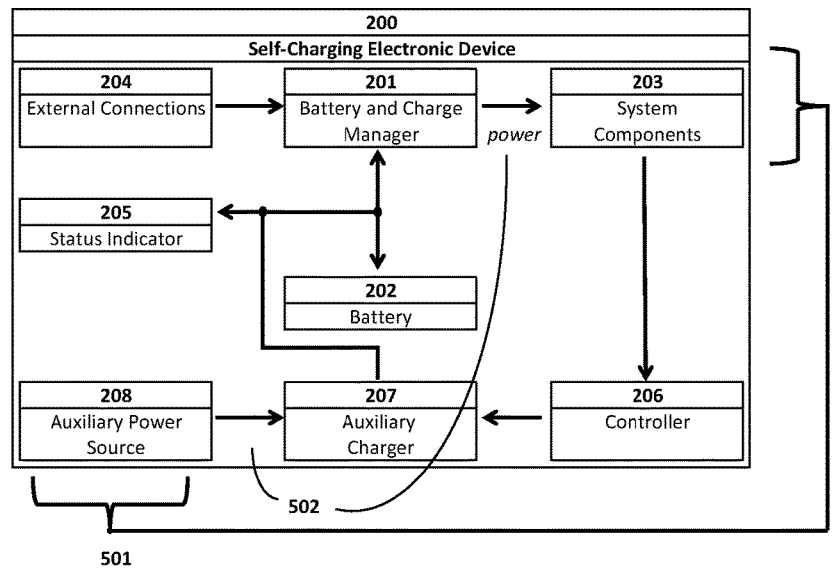
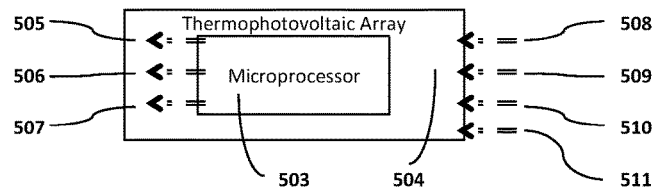
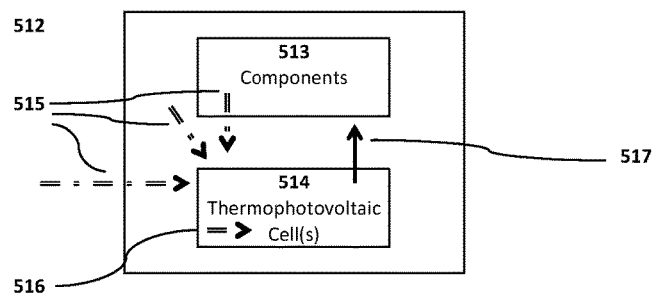

SELF-CHARGING ELECTRONIC DEVICES

CROSS REFERENCE TO RELATED APPLICATION

This application is a continuation in part of U.S. patent application Ser. No. 13/590,786 filed Aug. 21, 2012 and claims the benefit of U.S. Provisional Patent Application Nos. 61/792,783 filed Mar. 15, 2013 and 61/695,485, filed Aug. 31, 2012, the entirety of each is hereby incorporated by reference into this application.

BACKGROUND OF THE INVENTION

Field of the Invention

The present invention relates to methods, systems, apparatuses, computer readable media, and other means for reliably using thermophotovoltaic cells to power electronic devices.

Description of Related Art

Electronic devices are known which are powered by rechargeable batteries such as nickel-cadmium, lithium-ion, nickel-metal hydride, and rechargeable alkaline batteries. The batteries of such devices are often recharged using standard recharging means and methods, such as by plugging a charging cable into the device and into a conventional alternating current (AC) outlet. The battery of a device can be conventionally charged by plugging the device into another electronic device using a universal serial bus (USB) connection (such as a USB cable or docking station). However, it can be inconvenient or impossible for the user to charge the batteries when, for example, the user is traveling. In addition, a typical recharge will power the battery for only a limited amount of run time. After the battery has been drained, the user must recharge or replace the battery to continue using the electronic device.

Some electronic devices (e.g., calculators) can further use solar cells to power the device. However, such methods and devices are limited by small size of many electronic devices, which constrains the effective surface area for absorbing sunlight, as well as the inherent characteristics of solar cells, which require the device to track the sun to maintain consistent exposure to sunlight for stable power output. Consequently, while the voltage generated by the solar cells can be enough to power less energy demanding devices, the voltage can be insufficient for electronic devices that demand more power. Furthermore, as electronic devices include an increasing number of advanced features, larger sources of stable and consistent power are required. Thus, there are competing interests between the portability of these devices and the amount of available power.

The effectiveness of using known photovoltaic cells to charge electronic devices is additionally limited by composition and other properties of the cells which frustrate charge separation and transport and permit significant electron-hole pair recombination to occur. Unless rapidly separated and transported from the cell, photogenerated charges recombine and contribute to thermalization and, in low band gap semiconductors, photocorrosion. Increasing the thermal energy of such cells further reduces overall photoconversion efficiency (PCE) by lowering charge mobility and promoting additional recombination.

Thermalization inevitably occurs in such applications notwithstanding the relative speed and degree of separation and transport. In response to AM 1.5 G solar radiation, crystalline silicon cells with a 1.1 eV absorption edge are able to absorb photons representing approximately 77% of the solar spectrum (with wavelengths ranging from about 350 nm to about 1.1 μm); the remainder (with wavelengths ranging from about 1.1 μm to 1 mm) heats the cell and its surrounding structures and environment. Further, almost all of the photons in the flux absorbed by the cell have energies greater than the bandgap energy of silicon, and produce both an electron-hole pair and thermalization losses upon absorption. In total, more than about two thirds of the solar flux striking a conventional solar cell is converted to thermal energy.

Problematically, the performance of electronic devices also degrades in response to elevated temperature. The integration of conventional solar cells into electronic devices is thus further complicated by the implicit expectation that such devices be exposed to solar radiation. However, electronic devices generate heat since such devices are comprised in part of components which only use a portion of the charge they receive. For example, the amount of power discharged from a device's battery that is not used for device function instead increases the thermal energy of the device at rates dependent on the relative efficiency of the device's components. Thus, device manufacturers go to significant lengths to manage heat, in many cases by designing their devices to dissipate heat as a form of waste since it is generally present at low grade temperatures insufficient for known heat recovery technologies to operate cost-effectively, particularly at the scale of a electronic device.

The thermal energy produced by or imparted to known electronic devices, be it from the absorption and inefficient conversion of sunlight or the inefficient use of electrical energy, will eventually dissipate as the system and its surroundings achieve thermal equilibrium. The rate and degree to which that dissipation occurs is in part a function of the ambient temperature in the local environment, which is itself directly and indirectly heated by the vast majority of the incoming solar flux that never comes in contact with the surface of the cell. Most of that energy is absorbed and stored by the environment (e.g., air, water, land, buildings, electronic devices, and so on) in the form of thermal energy which is then released at low grade temperatures by convection, conduction and, importantly, emission of infrared radiation in every direction, day and night, 24 hours a day, and 365 days per year. Humanity then adds to those emissions by engaging in activities that create waste heat, for example, by burning coal and other fossil fuels to provide power to electronic devices. Historical attempts to access and convert such low grade sources of thermal energy into electricity have been limited and unsuccessful.

The increased use of electronic devices in recent years corresponds to increased fossil fuel consumption. For example, the two billion smartphones expected to be in use worldwide by 2014 will consume the equivalent of more than 80 million barrels of fossil fuel per year. Smartphone use alone is growing by more than about 40% per year, with each new generation evolving and selecting for increased performance. It is desirable to provide a method or device for meeting the power needs of such devices that does not rely on the combustion of fossil fuels.

In view of the conventional attempts, needs remain for improved methods, devices and systems for powering and managing thermal energy in electronic devices.

SUMMARY OF THE INVENTION

This invention relates to methods, systems, and apparatuses for using one or more thermophotovoltaic cells to power and operate a self-charging electronic device, such as a cellular phone, internet-capable device, media player, computer, charging device, battery or other electronic device.

As used herein, thermophotovoltaic devices generate electricity by utilizing radiation emitted at least in part from one or more sources of thermal energy other than the sun, and can also possess the ability to generate electricity directly from thermal energy, for example from temperature differentials and/or from solar radiation. Sources of thermophotovoltaic power can include any object with the ability to provide thermal energy to its surroundings, such as the components of a self-charging electronic device, the user of a self-charging electronic device, persons and things proximate to a self-charging electronic device, and the environment surrounding a self-charging electronic device.

Materials with temperatures above absolute zero emit radiation with a characteristic frequency distribution that is dependent upon the temperature of the emitter. The flux density, or radiant intensity (energy radiated per unit time, or power, per unit of area, $W/m^2$), $I(T)$, of the emitter is given by the product of the emissivity ($\epsilon$) of the emitter (a real number between 0 and 1), the Stefan-Boltzman constant ($\alpha=5.67\times10^{-8}$ W $m^{-2}$ $K^{-4}$), and the fourth power of the temperature (T) of the emitter in degrees Kelvin ($I(T)=\epsilon\sigma T^4$). The thermal emission spectrum of the emitter is then described using Planck's law of black body radiation, which is a function of the speed of light (c), Planck's constant ($h=6.626\times10^{-34}$ Js, or $4.14\times10^{-15}$ eVs), Boltzmann's constant (k $1.381\times10^{-23}$ J $K^{-1}$), wavelength ($\lambda$), and temperature (T) in degrees Kelvin ($R(\lambda)$ $(2\pi c^2$ $h/\lambda^5)(1/e^{hc/\lambda kT}-1)$). Integration of the Planck equation over the wavelength range yields the radiant intensity $I(T)$. The wavelength at which the maximum irradiance occurs is inversely proportional to the temperature, and is given by the Wien displacement law ($\lambda_{maximum}$ ($\mu$m)$=2,897.8/T$).

The radiant intensity of a material at room temperature (300 K) is approximately 500 $W/m^2$ or 0.05 $W/cm^2$ and the maximum emission occurs at approximately 10 $\mu$m. These emissions fall exclusively within the infrared (IR) spectrum: none have wavelengths ranging from 0.75 to 1.4 $\mu$m (near-infrared, or NIR) or from 1.4 to 3.0 $\mu$m (short-wavelength infrared, or SWIR); 22.5% ranges from 3.0 to 9.0 $\mu$m (mid-wavelength infrared, or MWIR); 38.9% is between 9.0 and 15.0 $\mu$m (long-wavelength infrared, or LWIR); 21.3% is between 15 $\mu$m and 20 $\mu$m (far infrared, or FIR); and the remaining 17% is between 20 $\mu$m and 1 mm (also FIR).

Known thermophotovoltaic systems are fundamentally limited by inadequate separation and transport capabilities. Such systems attempt to avoid recombination and photocorrosion by harvesting a relatively narrow range of IR radiation (typically NIR) emissions from an intense (high temperature) proximate source of radiation. It is common for such systems to first use the source to heat an emitter (e.g., a tungsten plate) with emissivity characteristics which in turn limits the incoming flux to wavelengths that the cell can more readily convert (e.g., NIR radiation using a GaSb cell with a 0.75 eV band gap). The spectral radiancy can be further restricted by placing a pass band filter between the emitter and the cell to reflect all but the desired wavelengths away from the cell. Despite these protections, the radiation incident upon the cell that is not converted to electricity heats the device, which reduces the charge carrier mobility and photoconversion efficiency (PCE) of the semiconductor. As a result, known thermophotovoltaic cells are limited to NIR systems designed to operate from about 1,300 to 2,000 K.

In the present invention, a microprocessor of a self-charging electronic device can be contiguous to or in communication with a thermophotovoltaic cell which can also optionally also be contiguous to or in communication with an exterior surface of the self-charging electronic device; and which thermophotovoltaic cell is at least in part comprised of structures which orthogonalize absorption and charge separation and that facilitate rapid charge transport to underlying electrical contacts, such that separation occurs more rapidly over comparatively much smaller distances (i.e., on the order of nanometers versus microns), thereby reducing the sort of recombination penalties and associated thermalization losses that plague known devices for converting the energy contained in photons into electrical energy. In one embodiment, the thermophotovoltaic cell is at least in part comprised of vertically-oriented, one-dimensional, monocrystalline, n-type anatase nanowires in communication with a transparent conductive substrate, and which are intercalated with a consortia of p-type quantum dots tuned for absorption of infrared and other radiation. In this architecture, the compositions and sizes of the quantum dots and nanowires can enable broad spectrum absorption and charge production, including by multiple exciton generation; and, the composition, structure, shape and orientation of the nanowires enable rapid charge separation and transport, thereby minimizing recombination and the associated thermalization and other losses. Thermal energy absorbed by this architecture can result in infrared emissions within the high surface area basal plane of the nanowires (e.g., from nanowire to nanowire) for absorption and further charge production by the thermophotovoltaic cell. In this manner, thermalization upon exposure to radiation can be reduced in comparison to known devices and, significantly, thermal energy from the microprocessor, thermophotovoltaic cell and/or other components of the self-charging electronic device, as well as from one or more sources external to the self-charging electronic device, becomes a valuable new source of electricity to power the self-charging electronic device. Heat is not merely dissipated and lost as a form of waste in such uses, but rather recovered as it is converted to additional electrical energy.

In one aspect of the present invention, an apparatus for operating a self-charging electronic device with self-charging electronic device power includes, but is not limited to, a voltage converter and a controller coupled to the voltage converter. The voltage converter includes an input capable of being coupled to a thermophotovoltaic power source and an output capable of being coupled to an electronic load, such as, for example, a self-charging electronic device. The voltage converter is configured to monitor or detect an amount of power drawn by the electronic load at the output of the voltage converter. In response to the monitored power drawn, the controller is configured to control the voltage converter to adjust further output power provided to the electronic load. As a result, the output voltage from the thermophotovoltaic power source is maintained within a predetermined range.

According to another aspect of the invention, a self-charging electronic device includes, but is not limited to, a processor, a memory coupled to the processor for storing instructions, when executed from the memory, cause the processor to perform one or more functions, a battery coupled to provide power to the processor and the memory, and a battery charging manager coupled to charge the battery using power derived from a plurality of power sources including a thermophotovoltaic power source.

In some cases, the amount of voltage and/or current generated by the thermophotovoltaic cells can not be enough to power the self-charging electronic device. Thus, in some embodiments, boost circuitry powered by a battery and/or the thermophotovoltaic cells can regulate the power generated by the thermophotovoltaic cells. The boosted power can then be used to power other components of the self-charging electronic device. In addition, the self-charging electronic device can include circuitry, such as bootstrap circuitry which can monitor the state of the battery. If the battery is not drained (e.g., battery is generating energy above a predetermined minimum threshold), the circuitry can connect the thermophotovoltaic cells in a series/parallel configuration, which can allow the thermophotovoltaic cells to generate a constant preset voltage as long as a subset of the thermophotovoltaic cells is operating. This configuration can provide protection by allowing the thermophotovoltaic cells to continue powering the self-charging electronic device even if the thermophotovoltaic cells are partially obstructed. In the series/parallel configuration, a subset of the thermophotovoltaic cells, for example pairs of thermophotovoltaic cells, can be connected in a parallel configuration to form parallel groups. Each of the parallel groups can then be connected in series.

In the event that the battery is drained (e.g., battery is generating energy below a predetermined minimum threshold), the boost circuitry can not be powered by the battery. In such circumstances, the thermophotovoltaic cells can be connected in a series configuration that facilitates the generation of a startup voltage sufficient to power the self-charging electronic device. The startup voltage can be configured to be higher than the voltage generated by the thermophotovoltaic cells in the series/parallel configuration. In some cases, the thermophotovoltaic cells can also be used to directly power the boost circuitry when the thermophotovoltaic cells are connected in the series configuration. As a result, the boost circuitry can continue to regulate the power generated by the thermophotovoltaic cells even when the battery is drained.

In some embodiments, surplus energy (e.g., generated energy that exceeds the load of the self-charging electronic device) can be used to charge the battery if the battery is not fully charged (e.g., the battery is generating energy at or below an operating threshold, which can be higher than or the same as the predetermined minimum threshold). The circuitry can detect when the battery has been charged to a value suitable for powering the boost circuitry, for example a value that exceeds the operating threshold. Once the battery is charged to a suitable value, the circuitry can connect the thermophotovoltaic cells in the series/parallel configuration to provide protection from issues caused under conditions where the thermophotovoltaic power sources have been at least partially obscured. In order to automatically reconfigure the thermophotovoltaic cells in different configurations, such as series and series/parallel configurations, switches can be placed between the thermophotovoltaic cells, a power plane, and/or a ground plane. The individual switches can then be opened and/or closed, thereby connecting the thermophotovoltaic cells in either the series/parallel or series configuration. In some embodiments, the switches can be selected such that their normal operating states, for example inactive states that require no input power, can automatically connect the thermophotovoltaic cells in the series configuration, such as in the event that the circuitry is not operating because of a drained battery.

It is known that self-charging electronic devices can be prone to decreased intermittency as compared to electronic devices equipped with solar cells or near field magnetic resonance (NFMR) or other wireless charging capabilities. The self-charging electronic devices disclosed herein primarily rely on more consistent power sources. For example, conventional solar flux is subject to many constraints which can lead to intermittency, such as the movement of the earth, the angle of the sun, the location of the self-charging electronic device, and whether or not the self-charging electronic device is in the user's pocket or is otherwise covered. In contrast, the user's pocket is transparent to infrared radiation. The self-charging electronic device of the present invention in most cases will be immersed in a flux of infrared radiation emitted from many directions by many sources. Further, the amount of infrared radiation emitted by objects is related to its temperature, and the temperature of the user and most infrared emitters in the user's proximity is likely to be consistent. Thermophotovoltaic self-charging electronic device of the present invention are not limited by the time of day or the user's preference for a particular covering or casing for his or her self-charging electronic device.

A self-charging electronic device of the present invention can receive or pull charge from itself and its environment notwithstanding its proximity to a wireless power source. NFMR and other wireless charging methods can be used with alternative embodiments of the invention. For example, once the battery is charged to a desired value, the circuitry can seek out and provide power to other self-charging electronic devices, and it can do so with a preference for the user's self-charging electronic devices before engaging other proximate devices through the cloud. In such instances, users would also have the option of allowing their self-charging electronic devices to contribute and receive charge from other devices, for example from one of the user's several self-charging electronic devices. In a further embodiment, a self-charging thermophotovoltaic battery of the present invention can push charge to the user's electronic device or devices by way of NFMR or other wireless charging method.

In one embodiment, a subset of the thermophotovoltaic cells can be configured to generate a constant preset voltage for powering the self-charging electronic device using a matrix of switches. In some embodiments, the self-charging electronic device circuitry can automatically reconfigure the flow of electricity generated by the thermophotovoltaic cells based on such factors as the operational state of the self-charging electronic device, the availability and amount of thermal energy, and the availability of multiple power sources.

The self-charging electronic devices of the present invention convert radiation emitted at least in part from one or more sources of thermal energy that are not the sun into additional charge, which sources can further include one or more components of the electronic devices themselves. Such capabilities allow the self-charging electronic devices to access multiple sources of consistent and stable power, and to realize improved component performance and battery life. The capability of absorbing and utilizing thermal energy improves the electronic device's heat tolerance, and provides increased options to reduce cost and to enhance the design, construction methods, component and feature inclusion, and performance of self-charging electronic devices.

The invention will be more fully described by reference to the following drawings.

BRIEF DESCRIPTION OF THE DRAWINGS

FIG. 5 is a schematic diagram of an alternate embodiment of the electronic device.

DETAILED DESCRIPTION

Figure 1:
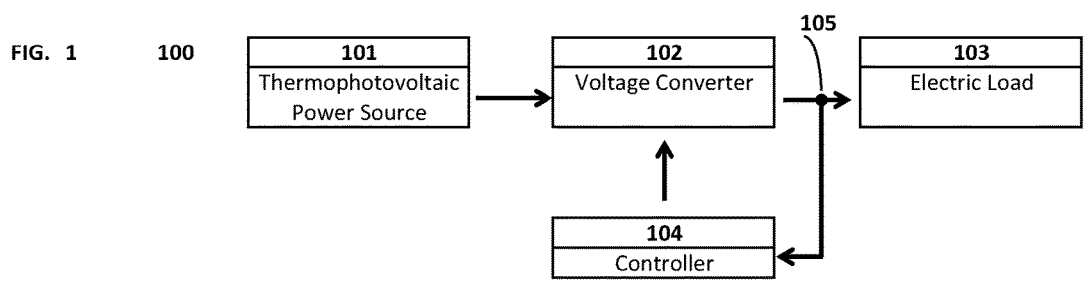
FIG. 1 is a schematic diagram of a thermophotovoltaic system in accordance with the teachings of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

In the following description, numerous details are set forth to provide a more thorough explanation of embodiments of the present invention. It will be apparent, however, to one skilled in the art, that embodiments of the present invention can be practiced without these specific details. In other instances, well-known structures and devices are shown in block diagram form, rather than in detail, in order to avoid obscuring embodiments of the present invention. Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Thermophotovoltaic Self-Charging Electronic Devices

The thermophotovoltaic cells of the present invention generate electricity by utilizing radiation emitted at least in part from one or more sources of thermal energy other than the sun. As used herein, the thermophotovoltaic cells can further also possess the ability to generate electricity directly from thermal energy, such as thermoelectrically, from temperature differentials and/or from solar radiation. Such cells can be at least in part comprised of aspects selected, designed and/or modified for its or their charge production, separation and transport properties, or charge attributes as used herein; and, alternatively or additionally selected, designed and/or modified for its or their thermal energy production, absorption, storage and/or release capabilities, or their thermal attributes as described herein. One or more components of the host self-charging electronic device housing the thermophotovoltaic cell can additionally be selected, designed and/or modified for its or their charge attributes and/or thermal attributes. For example, the thermal attributes of a thermophotovoltaic cell or its host self-charging electronic device can be selected to increase or decrease thermal conductivity or emissivity to alter the rate or means at or by which thermal energy is released from an aspect (e.g., more radiation and less conduction, or more or less conduction at a particular location, or more or less radiation in or from a particular direction). As a further example, one or more aspects of a thermophotovoltaic cell can at least in part be comprised of, integrated into, in communication with and/or proximate to one or more sources of thermal energy within the host self-charging electronic device.

The present invention provides a means to simultaneously orthogonalize light absorption and charge separation while rapidly transporting photogenerated charge by orthogonalizing absorption and charge separation with structures that also facilitate rapid charge transport to underlying electrical contacts, thereby, reducing recombination penalties and associated thermalization losses.

The majority of the environment inside and surrounding an electronic device includes objects that possess and emit thermal energy. The electronic device in most cases would be immersed in a flux of infrared radiation emitted from many directions by many sources. Those sources can additionally be candidates for thermal energy transfer by way of conduction or convection. The amount of thermal energy communicated by objects is proportionate to their relative temperatures, and is likely to be consistent in the proximity of the electronic device, which can lead to power output of increased stability. The thermophotovoltaic self-charging electronic device of the present invention would not be constrained, for example, by a user storing that device in his or her shirt pocket.

In one embodiment, an electronic device user having a body with an average surface area of 1.75 square meters emits about 1,000 Watts of infrared radiation and receives about 900 Watts from the environment, giving 1,900 watts/ 1.75 m^2=1,086 W/m^2=0.11 Watts/cm^2. An array of thermophotovoltaic cells, or thermophotovoltaic array, operating at 10% efficiency would harvest about 0.01 Watts/cm^2 from the user and, at the size of a standard shirt pocket (120 cm^2), and a continuous 1.2 Watts=1.2 Joule/second (J/s). A standard smartphone battery (32 G Battery 3.7V 1420 mA) would charge with 19,080 Joules. Thus, a fully discharged battery for that device would be recharged in 15,900 seconds, or about 4.4 hours. Since an electronic device having those specifications has a typical power consumption of between 0.7 Watts (idle) to about 1.3 Watts (full utilization), the thermophotovoltaic array of this example would be sufficient to power that electronic device continuously.

In another embodiment, a thermophotovoltaic array feeds off of waste heat produced by components within the host electronic device. The array is contained within the self-charging electronic device, in a configuration at least in part in proximity to components which generate thermal energy. In some variations, the thermophotovoltaic array could be integrated directly into self-charging electronic device components, such as a battery, processor, or display screen. In others, more than one thermophotovoltaic array can be included in more than one location within the self-charging electronic device, such as contiguous to two or more sides of one or more components within the device which generate thermal energy. For example, a thermophotovoltaic array can be incorporated into one or more layers of a coating, substrate and/or covering which provides or is part of the exterior of the self-charging electronic device. In further examples, the device includes aspects which act as storage medium for thermal energy to facilitate directed or preferential emission to the thermophotovoltaic array, thereby recovering and using as much of the waste heat produced by the array and other components of the electronic device as possible while achieving overall thermal management objectives for the device. In still other embodiments in which the self-charging electronic device is fully charged, the device routes surplus charge to a secondary battery, proximate device (e.g., wirelessly), or to the electric power grid. In such and other embodiments, self-charging electronic devices absorb and convert at least some thermal energy generated by the electronic device and/or from one or more sources external to the device to provide for improved component performance and battery life, and increased optionality for electronic device design and performance.

While the thermophotovoltaic cell device of the present invention can produce charge upon absorption of the light that a standard solar cell would convert, the inventive devices can access that radiation indirectly, for example, by absorption of infrared radiation emitted from the black substrate backing or other exterior surface of the device following exposure to an external thermal energy source (e.g., the sun). In another embodiment, a self-charging electronic device receives energy from one or more sources at the same time, such as from the user by radiation and induction and the device itself by radiation and conduction, as well as myriad other sources contributing to the thermal energy flux within which the self-charging electronic device is immersed.

In variations of preferred embodiments, a self-charging electronic device can include one or more thermophotovoltaic cells comprised at least in part of aspects which produce photogenerated charges and thermal energy following absorption infrared photons, as well as thermoelectric aspects which utilize local temperature differentials to directly convert thermal energy into electricity, such as by phonon generation and propagation. In such a device, the aspects producing photogenerated charges could be tuned for conversion of the energy contained in a first portion of the spectrum of radiation incident on the cells, while the thermoelectric aspects could be tuned for conversion of the energy contained in a second portion of that spectrum following absorption and thermalization. One or more thermophotovoltaic cells of such a device can also optionally include photovoltaic aspects which produce photogenerated charges and thermal energy following absorption of sunlight, including radiation other than infrared radiation. For example, an array of exemplary thermophotovoltaic cells can include various aspects which produce photogenerated charges following absorption of a portion of the ultraviolet, visible and infrared radiation incident on the array, as well as various thermoelectric aspects which produce charge in response to the thermalization caused by portion of the radiation absorbed by the array that is not converted into successfully extracted photogenerated charge.

It will be appreciated that any thermophotovoltaic cell can be used to power a self-charging electronic device by absorbing and converting thermal energy into electricity.

Techniques for Operating Self-Charging Electronic Devices with Thermophotovoltaic Power According to certain embodiments of the invention, an amount of power drawn at the point of a load of thermophotovoltaic power is monitored and the monitored power is used to control a voltage converter that provides regulated power. For example, contrary to conventional approaches where the voltage of an output of a power source is monitored and used to control a charger to consume the power, the amount of power, such as an amount of current or voltage into a load with known characteristics, being drawn is monitored at an input of an electronic load, such as, for example, a battery or a battery charger that utilizes the power to charge and/or recharge the battery is monitored. Based on the monitored power drawn, a controller, for example a programmable microcontroller is invoked to determine statuses of the power sources and to generate a control signal using a predetermined algorithm, in response to the monitored power being drawn by the electronic load. The control signal is used to control the voltage converter to adjust further amount of power to be drawn by the electronic load. The above operations can be performed via hardware, software, or a combination of both.

An exemplary circuit includes a voltage converter and a controller coupled to voltage converter. An input of the voltage converter is capable of being coupled to a thermophotovoltaic power source, which can include one or more thermophotovoltaic cells, or thermophotovoltaic cell arrays. The thermophotovoltaic power source is configured to absorb energy from radiation (e.g., infrared) and thermal energy (e.g., by conduction or convection) and transform the absorbed energy into electricity. The voltage converter is configured to convert the electricity from the thermophotovoltaic power source into proper form of electric power that is suitable to be used by the electronic load.

In addition, a controller is coupled to a node coupling an input of the electronic load and an output of the voltage converter. Specifically, a controller is configured to monitor an amount of power being drawn from the output of the voltage converter by the electronic load. For example, the controller can be configured to monitor an amount of current being drawn by the electronic load, for example, using a current sense resistor. Alternatively, the controller can be configured to monitor the voltage of node coupling the electronic load and the voltage converter, or a combination of both voltage and current being drawn at node.

In response to the monitored power being drawn, according to one embodiment, the controller determines the statuses of the thermophotovoltaic power source. For example, based on the monitored power being drawn, the controller is able to determine whether the maximum power that the thermophotovoltaic power source can generate has been reached, given the characteristic of the thermophotovoltaic power source. Alternatively, in response to the monitored power being drawn, the controller determines whether an output voltage of the thermophotovoltaic power source has dropped below a predetermined threshold in view of certain characteristics of thermophotovoltaic power source.

Based on the determined statuses of the thermophotovoltaic power source, according to one embodiment, the controller is configured to generate a control signal to control the voltage converter. In response to the control signal received from the controller, the voltage converter is configured to adjust a subsequent amount of power to be drawn by the electronic load, such that the output of the thermophotovoltaic power source can be maintained within a predetermined range.

In one embodiment, the controller is a programmable controller that can be programmed to perform the determination described above based on a predetermined algorithm. For example, controller can include a machine-readable storage medium (not shown) to store one or more machine instructions. In response to the monitored power being drawn, the controller is configured to execute the one or more machine instructions stored therein to determine the status of the thermophotovoltaic power source. The one or more machine instructions can include one or more executable routines, which can be programmed and stored in the machine-readable storage medium of controller. The one or more routines can be used to generate the control signal based on the monitored power being drawn using a predetermined relationship between the monitored power and one or more characteristics of the thermophotovoltaic power source.

In one embodiment, a thermophotovoltaic array can be integrated with the exemplary circuit. Alternatively, a thermophotovoltaic array can be implemented external to the exemplary circuit and is capable of being interfaced with the exemplary circuit, such as, for example, by way of a dedicated power interface or a shared communication interface. Additional and alternative types of power sources and configurations can also be used.

The electronic load can include, but is not limited to, a self-charging electronic devices include, but are not limited to, a laptop computer, a media player (e.g., MP3 or video player), a cellular phone, an internet-capable device, a personal digital assistant (PDA), an image processing device, for example a digital camera or video recorder, other portable computing devices, an electric vehicle, and/or any other electronic devices, or a combination thereof (e.g., a combo device). The electronic load can further include a battery and/or a battery charger to charge or recharge the battery using the electric power generated by the thermophotovoltaic array.

According to one embodiment, an exemplary circuit includes, but is not limited to, a voltage converter having an input coupled to a thermophotovoltaic array, The voltage converter includes an output coupled to an electronic load, which can include a battery, battery charger, and/or a electronic device as described above. In one embodiment, voltage converter includes, but is not limited to, a power switching device, in this example, having switches, and a switching regulator, such as a pulse width modulator or PWM, to control a switching duty cycle of the power switching device, which switching device can be a field effect transistor (FET) or a bipolar transistor, or such other devices.

The voltage converter can further include an energy storage device, for example an inductor, to store energy during a switching duty cycle. An exemplary circuit can also include another energy storage device, for example a capacitor, to temporarily store energy derived from the thermophotovoltaic array, for example, during an initialization phase of the voltage converter.

An exemplary circuit can include an output power sensing circuit to sense the power being drawn by the electronic load. The sensing circuit can include a current sensing device and/or voltage sensing device. For example, the sensing circuit can include a current sensing resistor and a current sensor. The current sensing resistor is coupled in series between an output of the voltage converter and an input of the electronic load. Typically, a current sensing resistor is a relatively high precision resistor, where an amount of current flowing through the resistor can be measured by measuring a voltage drop across the current sensing resistor. Since the load is a battery the voltage of the load is constant so the power is proportional to the current. The change in power can then be used to determine that the maximum power available from the thermophotovoltaic cell is being transferred to the load.

In one embodiment, the apparatus includes, but is not limited to, a voltage converter and a controller coupled to the voltage converter. The voltage converter includes an input capable of being coupled to a thermophotovoltaic power source and an output capable of being coupled to an electronic load, such as, for example, a self-charging electronic device. The voltage converter is configured to monitor or detect an amount of power drawn by the electronic load at the output of the voltage converter. In response to the monitored power drawn, the controller is configured to control the voltage converter to adjust an amount of power to be drawn subsequently. As a result, the output voltage from the thermophotovoltaic cells is maintained.

One embodiment includes, but is not limited to, generating regulated power through use of a voltage converter to power a self-charging electronic device from an array of one or more thermophotovoltaic cells, monitoring power drawn at an output of the voltage converter by the self-charging electronic device and, in response to the monitored power, controlling the voltage converter to adjust further regulated power to the self-charging electronic device. In response to an output voltage from a thermophotovoltaic array, a voltage converter, for example a booster converter, is configured to provide a regulated power to an electronic load such as, a self-charging electronic device, self-charging battery, and/or self-charging battery charger. An amount of power, for example current and/or voltage into a load with known characteristics, drawn at the output of the voltage converter by the electronic load is monitored, for example, using a current sense device. In response to the monitored power, adjusting, such as using a programmable controller the regulation, for example controlling a pulse width modulator of the voltage converter, of the power further to be provided to the electronic load. Other operations can also be performed.

As a result, with at least some of the foregoing power management techniques, the output of the thermophotovoltaic array can be maintained within a consistent range and chances of a sharp drop of voltage or power output from the thermophotovoltaic array due to being overdrawn can be eliminated, in order to provide power to an electronic load with relatively high stability.

Power Interfaces

As described above, a conventional electronic device typically uses an AC adaptor to charge a battery of the device, or can incorporate photovoltaic cells to directly power up the device. Known electronic devices lack a flexible and smart power interface that can provide power to the device from an AC/DC power and a source of thermophotovoltaic power, as well as other power sources. According to one embodiment, a self-charging electronic device includes a power interface that can provide power to the device from one or more a thermophotovoltaic cells and variety of different power sources based on the operating circumstances of the device. According to certain embodiments of the invention, a self-charging electronic device can first draw power from a traditional AC/DC power source, and then thermophotovoltaic power generated by the self-charging electronic device, and then thermophotovoltaic power available from other sources or devices. In other embodiments of the invention, a self-charging electronic device can first draw power from thermophotovoltaic power generated by the self-charging electronic device, and then thermophotovoltaic power available from other sources or devices, and then a traditional AC/DC power source. The device can also draw power from a variety of communication lines, for example, a telephone line, or a combination of any of the foregoing sources. In still further embodiments, a self-charging electronic device can preferentially draw from thermophotovoltaic power generated by the self-charging electronic device, and secondarily from one or more other sources wirelessly, for example NFMR; such devices would not need wires or plugs to draw power from traditional power sources, for example AC/DC sources, and would enable entirely cordless charging a feature which could significantly improve the marketability of the device.

Any of these power sources can be used to charge or recharge a battery of a self-charging electronic device. When a thermophotovoltaic power source is utilized, one or more power prioritization and tracking techniques described above can be utilized, for example, as a part of power management component or a battery charging manager of the self-charging electronic device. A battery charging manager of a self-charging electronic device is able to determine the operating environment of the self-charging electronic device and the availability of the various power sources. In response, the battery charging manager can select one or more of the power sources that are appropriate under the circumstances to be used to charge a battery of the self-charging electronic device.

Various embodiments of self-charging electronic devices include, but are not limited to, a laptop computer, a media player (e.g., MP3 or video player), a cellular phone, an internet-capable device, a personal digital assistant (PDA), an image processing device (e.g., a digital camera or video recorder), other portable computing devices, an electric vehicle, and/or any other electronic devices, or a combination thereof (e.g., a combo device).

In another embodiment, a self-charging electronic device includes, but is not limited to, a processor, a memory coupled to the processor for storing instructions, when executed from the memory, which cause the processor to perform one or more functions, a battery coupled to provide power to the processor and the memory, and a battery charging manager coupled to charge the battery using power derived from a plurality of power sources including a thermophotovoltaic power source.

In a further embodiment, a self-charging electronic device includes a battery charging manager to manage power to be supplied to one or more system components. When AC power is available, power manager can draw power directly from the AC power (not shown) to provide power to system components. Meanwhile, the power manager can distribute a portion of the AC power to charge or recharge battery. When the AC power is not available, the battery charging manager can enable the battery to provide power to system components for operations.

In addition, battery charging manager can draw power from a variety of power sources to charge or recharge battery, which in turn can be used to provide power to the system components subsequently or substantially concurrently, and then, after the self-charging electronic device's battery is charged to the desired degree, other self-charging electronic devices by inductive or other means. According to certain embodiments of the invention, various power sources can include power provided from a communication line or media, such as, for example, a network connection, a universal serial bus (USB) connection, an IEEE 1394 compatible connection, a telephone line, or a combination of any of these power sources.

In addition, the battery charging manager can further draw power from one or more thermophotovoltaic cells or arrays through an auxiliary charger and/or a controller. In one embodiment, the auxiliary charger and controller can be implemented using some or all of the techniques described above. According to one embodiment, a battery charging manager is configured to determine the statuses of various power sources. Based on the statuses of the power sources, the battery charging manger can select one or more of the power sources, individually or otherwise, for example substantially concurrently, to charge the battery.

According to certain embodiments, various external power sources can be coupled to the self-charging electronic device through one or more power interface circuits. Alternatively, these power sources can be coupled to the self-charging electronic device using a shared interface circuit with data connection. Such power interface circuits can be based on conduction, induction, or other means. In addition, the controller can communicate with one or more system components to further enhance the self-charging electronic device power charging techniques based on the operating environment or statuses of the system components. Further, a self-charging electronic device can include battery level indicator for indicating a current battery level to a user, and can optionally include a thermal imaging device and a flux density indicator for indicating the amount of power available from sources external to the self-charging electronic device. Other configurations can exist.

In an alternative embodiment of the invention, an thermophotovoltaic array is external to the self-charging electronic device, and can be non-fixedly coupled to an auxiliary charger. That is, one or more thermophotovoltaic cells or arrays can be plugged into and removed from the self-charging electronic device, for example wirelessly or by using a cable. The auxiliary charger and/or controller can further include plug-n-play capabilities to detect whether the thermophotovoltaic array is inserted and whether it is appropriate to use the power drawn from the thermophotovoltaic array to charge or recharge the battery. In this embodiment, the thermophotovoltaic array can be manufactured by the same manufacturer of the self-charging electronic device or a third party.

In another embodiment of the invention, the thermophotovoltaic array and auxiliary charger are implemented as a power package external to an electronic device. The power package becomes a self-charging electronic power package that can be plugged into the self-charging or other electronic device, and can alternatively be integrated into a case, cover, other enclosure for the device, or an item of the user's clothing. In that fashion, conventional electronic devices can optionally be given self-charging capabilities to use and derive charge from the thermophotovoltaic arrays disclosed herein. Similarly, the power package can be manufactured by the same manufacturer of the self-charging electronic device or a third party.

In still another embodiment, the power package further includes a second auxiliary charger and an auxiliary battery, while the electronic device maintains a first auxiliary charger. The power package becomes a self-charging electronic power package that can be plugged into the electronic device via an interface circuit, for example, with or without a cable. In this embodiment, the auxiliary battery can be charged by the second auxiliary charger using power derived from the auxiliary power source, including one or more thermophotovoltaic cells or arrays. Thus, the auxiliary battery can be charged while the power package is not coupled to the self-charging electronic device. The charged auxiliary battery can then be used to charge or recharge the battery, when the power package is coupled to the self-charging electronic device, for example by wired or wireless means. Alternatively, when the power package is coupled to the self-charging electronic device, such as with a cable, the auxiliary battery can be charged by the second auxiliary charger using power derived from the thermophotovoltaic array, while providing power to charge the battery substantially concurrently through use of the auxiliary charger. The auxiliary charger can be implemented with some or all of the thermophotovoltaic power management techniques described above. The self-charging capability disclosed herein can thus optionally be decoupled from an electronic device to allow users to select from conventional and self-charging electronic devices.

An exemplary process can be performed by a processing logic that can include hardware, including circuitry, dedicated logic, and the like, software, such as is run on a dedicated machine, or a combination of both. In one embodiment, a process includes, but is not limited to, determining statuses of a plurality of power sources available to the self-charging electronic device, where the plurality of power sources includes one or more thermophotovoltaic cells and/or arrays, and selecting from of the plurality of power sources to charge a battery of the device, including selecting from amongst one or more thermophotovoltaic cells and/or arrays and other power sources when an operating environment is appropriate. Various power sources can be provided to charge one or more batteries of a self-charging electronic device, and processing logic determines statuses (e.g., availability) of such sources. In response to a given operating environment of the self-charging electronic device processing logic selects at least one of the multiple power sources that is appropriate under the circumstances to charge or recharge the battery of the self-charging electronic device. Other operations can also be performed.

Methods of Powering Thermophotovoltaic Cells

Some embodiments of the invention focus on circuitry for controlling multiple thermophotovoltaic cells. The thermophotovoltaic cells can generate voltage in response to being exposed to radiation, such as infra-red and thermal energy. Because the amount of voltage generated by the thermophotovoltaic cells can not be enough to power some features of an advanced self-charging electronic device, some embodiments of the invention can include battery-powered boost circuitry. The boost circuitry can boost the voltage before the voltage is provided to one or more components of the self-charging electronic device. In the event that a battery for powering the boost circuitry is drained, bootstrap circuitry can connect the thermophotovoltaic cells in a configuration such that a constant preset voltage can be generated as long as a subset of the thermophotovoltaic cells is operating. Furthermore, in the event that the battery is drained, the thermophotovoltaic cells can be automatically connected in a different configuration such that the thermophotovoltaic cells can generate a higher startup voltage.

Because thermophotovoltaic cells can be embedded in the exterior of the device, including coated on, integral to or otherwise in communication with the display and/or user input components of the self-charging electronic device, at least a portion of the exterior can be made from a material that is transparent to at least some radiation. Further, if at least a portion of the exterior is comprised of a material that has low thermal conductivity, a material which does not facilitate dissipation of heat, internally generated thermal energy could be harnessed to generate power. For example, the thermophotovoltaic cell or cells can be integrated into, or made to be in direct communication with, specific components of the self-charging electronic device which generate thermal energy. In such cases, the thermal energy producing components will provide thermal energy (by conduction) and infrared radiation (by emission) to the thermophotovoltaic cell, both of which will be at least in part absorbed by the thermophotovoltaic cell or cells, thus reducing the thermal impact of such heat producing components on other components of the self-charging electronic device.

It will be appreciated that thermophotovoltaic cells can be placed on and/or within any other portion of the self-charging electronic device depending on, for example, the energy requirements of the device, the anticipated use of the device, the functionality of the device, the number and type of self-charging electronic device powered mode(s) of the device, and/or the energy output of each thermophotovoltaic cell. It will also be appreciated that a self-charging electronic device can be any suitable device such as, for example, a laptop computer, a media player (e.g., MP3 or video player), a cellular phone, an internet-capable device, a personal digital assistant (PDA), an image processing device, such as a digital camera or video recorder, other portable computing devices, an electric vehicle, and/or any other electronic devices, or a combination thereof (e.g., a combo device); and, that a device can include control circuitry, memory, communications circuitry, display circuitry, user input circuitry, a display, power management circuitry, and/or a bus. The control circuitry can include, for example, circuitry that can be configured to perform any suitable function, and can be used to run operating system applications, media playback applications, media editing applications, and/or any other application.

Power management circuitry can include thermophotovoltaic cells that can be used to power device. In some embodiments, power management circuitry can include additional circuitry for controlling and connecting the thermophotovoltaic cells in different configurations. The bus can provide a data transfer path for transferring data to, from, or among control circuitry, memory, communications circuitry, display circuitry, user input circuitry, power management circuitry, and/or any other components of self-charging electronic device. For example, power management circuitry can communicate to control circuitry, via bus, that the amount of available energy is low. As a result, control circuitry can conserve energy by entering a energy conserving mode, for example dimming the display and/or shutting down certain lower priority applications. In addition, if self-charging electronic device also includes communications circuitry that is capable of supporting wireless communications and is enabled, control circuitry can send a command to the communications circuitry to temporarily disable wireless communications. Control circuitry can then wait for one or more control signals from power management circuitry, indicating that energy has been restored to normal levels. After receiving these signals, some or all of the device functions that were disabled to conserve power can be restored.

Circuitry can include thermophotovoltaic cells, bootstrap circuitry, boost circuitry, second stage boost circuitry, and battery. Although all of the components in circuitry can be internal to a self-charging electronic device, alternatively the various components can also be connected externally. For example, the self-charging electronic device can include bootstrap circuitry and battery, but thermophotovoltaic cells, boost circuitry, and second stage boost circuitry can be external to the self-charging electronic device. For example, thermophotovoltaic cells, boost circuitry, and second stage boost circuitry can be integrated in a portable charger. Thus, an interconnect (e.g., a USB interface) can be used connect the self-charging electronic device to the thermophotovoltaic cells and the boosting circuitries.

One or more batteries can power the self-charging electronic device, regardless of the activation status of the thermophotovoltaic cells. The battery(ies) can be any suitable type of standard rechargeable battery such as, for example, a nickel-cadmium, a lithium-ion, a nickel-metal hydride, rechargeable alkaline battery, or such other devices for receiving, storing and providing charge.

Bootstrap circuitry can be a programmable controller, such as an application-specific integrated circuit, that can be programmed to monitor various power levels in circuitry and control other components in circuitry. For example, bootstrap circuitry can monitor the charge on battery and determine if battery is drained. Bootstrap circuitry can determine that the battery is drained, for example, if the battery is generating energy below a predetermined minimum threshold. As another example, bootstrap circuitry can be capable of connecting thermophotovoltaic cells in a particular configuration. Bootstrap circuitry can be integrated on the electronic device in any suitable way. For example, bootstrap circuitry can be included in control circuitry that controls other functions on the self-charging electronic device. In some cases, bootstrap circuitry can also be kept separate from the control circuitry. Bootstrap circuitry can include a machine-readable storage medium that stores one or more machine instructions. For example, bootstrap circuitry can be configured to execute one or more machine instructions for connecting thermophotovoltaic cells in a particular configuration depending on the state of the battery.

The circuitry can include thermophotovoltaic cells which can generate voltage for powering a self-charging electronic device when exposed to radiation and thermal energy. However, situations can arise when the user can be in a source poor environment, for example, if the user looses the electronic device or otherwise exposes the electronic device to conditions under which the sources of infrared radiation and thermal energy are too small to provide sufficient power to power the electronic device. In such instances, bootstrap circuitry can connect thermophotovoltaic cells in a configuration that allows the thermophotovoltaic cells to generate a constant preset voltage as long as a subset of the thermophotovoltaic cells is operating.

For example, four thermophotovoltaic cells can be placed on and/or within a self-charging electronic device to power the device, where two thermophotovoltaic cells form a first thermophotovoltaic cell chain, and the other two thermophotovoltaic cells form a second thermophotovoltaic cell chain. It will be understood that although only four thermophotovoltaic cells are discussed, additional thermophotovoltaic cells can be added to the system to form a multi-cell array. In some cases, if one or more of the thermophotovoltaic cells are obstructed from a light source, the voltage output of the thermophotovoltaic cells will be diminished. In order to configure the thermophotovoltaic cells to facilitate the generation of a constant preset voltage, bootstrap circuitry can connect multiple thermophotovoltaic cells such that the thermophotovoltaic cells are electrically connected in a series/parallel configuration. In the series/parallel configuration, the thermophotovoltaic cells can produce a constant preset voltage as long as a subset of the thermophotovoltaic cells is operating. For example, a first chain or subset of the thermophotovoltaic cells can be connected in a parallel configuration to form a first parallel group. In addition, a second chain or subset of the thermophotovoltaic cells can be connected in a separate parallel configuration to form a second parallel group. Finally, the first parallel group and the second parallel group can be connected in series to form the series/parallel configuration.

In some embodiments, switches can be placed between thermophotovoltaic cells, a power plane, and/or a ground plane, for example, enabling the bootstrap circuitry to connect the thermophotovoltaic cells in a series/parallel configuration by closing certain switches and opening others switch. In such a configuration, a pair of thermophotovoltaic cells can generate a voltage to power the self-charging electronic device. For example, if two horizontally paired thermophotovoltaic cells are obstructed, other thermophotovoltaic cells can generate the voltage. As another example, if each thermophotovoltaic cell generates 0.5 V, then a pair of thermophotovoltaic cells can be capable of producing 1.0 V (two thermophotovoltaic cells in series) in the series/parallel configuration In some embodiments, the circuitry can actively monitor for reduced voltage output from the thermophotovoltaic cells and automatically connect the thermophotovoltaic cells such that a constant preset voltage can continue to be generated in a series/parallel configuration. In the event that there is a partial obstruction of the thermophotovoltaic cells, the thermophotovoltaic cells can be reconnected around the partial obstruction. For example, multiple thermophotovoltaic cells, for example a multi-cell array, can be placed on a portable computing system, such as a laptop. If the user were to place a cold object on part of the surface of a portable computing system, the output of any portion of the multiple thermophotovoltaic cells can decrease. The circuitry can detect this condition by monitoring for a reduced voltage output from the thermophotovoltaic cells. In response to detecting a reduced voltage output, the circuitry can re-route the rest of the thermophotovoltaic cells. For example, a matrix of switches can open or close in order to re-route the rest of the thermophotovoltaic cells. In a new configuration, the subset of the thermophotovoltaic cells that are not partially obstructed can continue to generate a constant preset voltage to power the self-charging electronic device.

In some embodiments, the constant preset voltage generated by the subset of thermophotovoltaic cells can be less than the amount needed to power the self-charging electronic device. Thus, in some cases, circuitry can also include boost circuitry which can determine that the power generated by the thermophotovoltaic cells is insufficient to power one or more components of the self-charging electronic device. In response to determining that the power generated by the thermophotovoltaic cells is insufficient, boost circuitry can regulate the power generated by the thermophotovoltaic cells, such as to boost the constant preset voltage to a higher boost voltage. Boost circuitry can, for example, use voltage sensing or output current sensing to boost the power generated by the thermophotovoltaic cells. The power generated by boost circuitry can then directly be used to power the self-charging electronic device and/or any of its individual components, for example boost the constant preset voltage from 1.0 V to 5.0 V. In some cases, boost circuitry can be capable of boosting the constant preset voltage to a slightly higher value (e.g., from 1.0 V to 2.0 V).

Any suitable circuitry can be used to implement boost circuitry. For example, boost circuitry can be a charge pump that uses capacitors to boost the voltage. The capacitors can store energy provided by a battery. Energy that is stored can then be used to boost the voltage generated by the thermophotovoltaic cells. Additionally, if the power generated by boost circuitry is still not sufficient to power the self-charging electronic device, circuitry can also include optional second stage boost circuitry. Second stage boost circuitry can provide an additional boost to the voltage generated by boost circuitry. Second stage boost circuitry can include any suitable circuitry that does not need to be powered by a battery such as, for example, an inductor-based boost converter. Second stage boost circuitry can be capable of generating a large range of output voltages from an input voltage that is above a certain threshold, such as 2.0 V. For example, when provided with an input voltage of 2.0 V, second stage boost circuitry can boost the input voltage to 5.0 V. In some cases, second stage boost circuitry can boost the input voltage to values greater than 5.0 V.

Any surplus energy provided by boost circuitry and/or second stage boost circuitry can be used to charge battery if it is not fully charged. The battery can be considered not fully charged if it is generating energy at or below an operating threshold, which can be higher or the same as the predetermined minimum threshold. In order to power boost circuitry, battery can need to be partially charged. Thus, when battery is drained, the voltage generated by thermophotovoltaic cells in the series/parallel configuration can no longer be sufficient to power the self-charging electronic device. Thus, in response to determining that battery is drained, thermophotovoltaic cells can be connected in a different configuration to facilitate the generation of a startup voltage which can power the self-charging electronic device. For example, thermophotovoltaic cells can be connected in a series configuration by opening and closing selected switches. In some embodiments, bootstrap circuitry can connect the switches in the series configuration and, in other embodiments, switches can be selected such that their normal operating states can automatically connect the thermophotovoltaic cells in the series configuration. In some embodiments, switches can be relays. Each relay is either normally open or normally closed in the inactive state. Thus, when the switches are operating in their normal operating states, the thermophotovoltaic cells can be automatically connected in the series configuration. In some embodiments, switches can be field-effect transistors. For example, a switch can be an enhancement-mode p-type field effect transistor (PFET), which can be in a normally open state. As another example, a switch can be a depletion mode field-effect transistor (FET), which can be in a normally closed state. As yet another example, a switch can be an enhancement mode n-type field effect transistor (NFET), which can be in a normally open state. As a further example, a switch can be an enhancement mode FET, which can be in a normally open state. Persons skilled in the art will appreciate that any suitable types of devices which can operate properly in their normal states can be used for switches.

Once the thermophotovoltaic cells are connected in a series configuration, which can maximize the overall voltage generated by the thermophotovoltaic cells, a startup voltage can be generated that powers the self-charging electronic device. For example, if each thermophotovoltaic cell is capable of producing a voltage of 0.5 V, then the series combination of four thermophotovoltaic cells can produce a combined voltage of 2.0 V. In some embodiments, the startup voltage can be sufficient to directly power the self-charging electronic device. In addition, when the thermophotovoltaic cells are connected in the series configuration, the thermophotovoltaic cells can be used to directly power boost circuitry. As a result, boost circuitry can continue to regulate the power generated by the thermophotovoltaic cells even when battery is drained. In some cases, if the energy demands of the self-charging electronic device are greater, the startup voltage can also be boosted by second stage boost circuitry. The boosted voltage can then be used to power the self-charging electronic device.

After the self-charging electronic device has been powered by the startup voltage, any surplus energy (e.g., energy that exceeds the load of the self-charging electronic device) can be used to charge the drained battery. The surplus energy can be generated by thermophotovoltaic cells and boost circuitry. After the battery has been charged to a value suitable for powering boost circuitry, bootstrap circuitry can then switch thermophotovoltaic cells to a series/parallel configuration. In some cases, the value that battery is charged to can exceed an operating threshold, which can be higher than or the same as the predetermined minimum threshold.

Once thermophotovoltaic cells have been connected in a series/parallel configuration, thermophotovoltaic cells can power the self-charging electronic device even when they are partially obstructed. Furthermore, since battery has been charged to a suitable value, it can provide energy to power boost circuitry. As a result, although thermophotovoltaic cells can be generating less power in a series/parallel configuration than in a series configuration, boost circuitry can regulate the power. The regulated power can then be fed to second stage boost circuitry. Although circuitry with a second stage boost circuitry can be used, it will be understood that, in some cases, the thermophotovoltaic cells can generate enough voltage in both the series and the series/parallel configurations to power the self-charging electronic device and charge battery without second stage boost circuitry. In such cases, boost circuitry can be powered by battery, the thermophotovoltaic cells, or any combination thereof. Furthermore, although the previous discussion has been directed to thermophotovoltaic cells on self-charging electronic devices, such a configuration can also be applied to other thermophotovoltaic powered systems.

FIG. 1 is a block diagram illustrating an example of an apparatus for operating an electronic device with thermophotovoltaic power according to one embodiment of the invention. In one embodiment, the apparatus includes, but is not limited to, a voltage converter and a controller coupled to the voltage converter. The voltage converter includes an input capable of being coupled to a thermophotovoltaic power source and an output capable of being coupled to an electronic load, such as, for example, a self-charging electronic device. The voltage converter is configured to monitor or detect an amount of power drawn by the electronic load at the output of the voltage converter. In response to the monitored power drawn, the controller is configured to control the voltage converter to adjust an amount of power to be drawn subsequently. As a result, the output voltage from the thermophotovoltaic power source is maintained within a predetermined range.

Referring to FIG. 1, circuit 100 includes a voltage converter 102 and a controller 104 coupled to voltage converter 102. An input of the voltage converter 102 is capable of being coupled to thermophotovoltaic power source 101, which can include one or more thermophotovoltaic cells, or thermophotovoltaic cell arrays. The thermophotovoltaic power source 101 is configured to absorb energy and transform the absorbed energy into electricity. Voltage converter 102 is configured to convert the electricity from thermophotovoltaic power source 101 into proper form of electric power that is suitable to be used by electronic load 103.

In addition, controller 104 is coupled to a node 105 coupling an input of electronic load 103 and an output of voltage converter 102. Specifically, controller 104 is configured to monitor an amount of power being drawn from the output of voltage converter 102 by electronic load 103. For example, controller 104 can be configured to monitor an amount of current being drawn by electronic load 103, for example, using a current sense resistor (not shown). Alternatively, controller 104 can be configured to monitor the voltage of node 105 coupling electronic load 103 and voltage converter 102, or a combination of both voltage and current being drawn at node 105.

In response to the monitored power being drawn, according to one embodiment, controller 104 determines the statuses of thermophotovoltaic power source 101. For example, based on the monitored power, controller 104 is able to determine whether the maximum power that thermophotovoltaic power source 101 can generate has been reached, given the characteristic of thermophotovoltaic power source 101. Alternatively, in response to the monitored power being drawn, controller 104 determines whether an output voltage of thermophotovoltaic power source 101 has dropped below a predetermined threshold in view of certain characteristics of thermophotovoltaic power source 101.

Based on the determined statuses of the thermophotovoltaic power source 101, according to one embodiment, controller 104 is configured to generate a control signal to control voltage converter 102. In response to the control signal received from controller 104, voltage converter 102 is configured to adjust a subsequent amount of power to be drawn by electronic load 103, such that the output of thermophotovoltaic power source 101 can be maintained within a predetermined range.

In one embodiment, controller 104 is a programmable controller that can be programmed to perform the determination described above based on a predetermined algorithm. For example, controller 104 can include a machine-readable storage medium (not shown) to store one or more machine instructions. In response to the monitored power being drawn, controller 104 is configured to execute the one or more machine instructions stored therein to determine the status of thermophotovoltaic power source 101. The one or more machine instructions can include one or more executable routines, which can be programmed and stored in the machine-readable storage medium of controller 104. The one or more routines can be used to generate the control signal based on the monitored power being drawn using a predetermined relationship between the monitored power and one or more characteristics of thermophotovoltaic power source 101.

In one embodiment, thermophotovoltaic power source 101 can be integrated with circuit 100. Alternatively, thermophotovoltaic power source 101 can be implemented external to exemplary circuit 100 and is capable of being interfaced with exemplary circuit 100. It is appreciated that thermophotovoltaic power source 101 is used herein as an example for the purposes of illustration only. Other types of power sources can also be applied with the teachings of the present invention.

Electronic load 103 can include, but is not limited to, an electronic device, such as, for example, a computer; a media player; a cellular phone; a smartphone; an internet-capable device; a personal digital assistant; an image capture or processing device; a handheld or other portable computing device; and, an electric vehicle, or a combination of any of these devices. Electronic load 103 can further include a battery and/or a battery charger to charge or recharge the battery using the electric power generated/converted from thermophotovoltaic power source 101. Similarly, according to one embodiment, electronic load 103 can be integrated with circuit 100. Alternatively, electronic load 103 can be implemented external and is capable of being interfaced with circuit 100, such as, for example, via a dedicated power interface or through a shared communication interface, for example a network interface and the like. Other configurations can exist.

Figure 2:
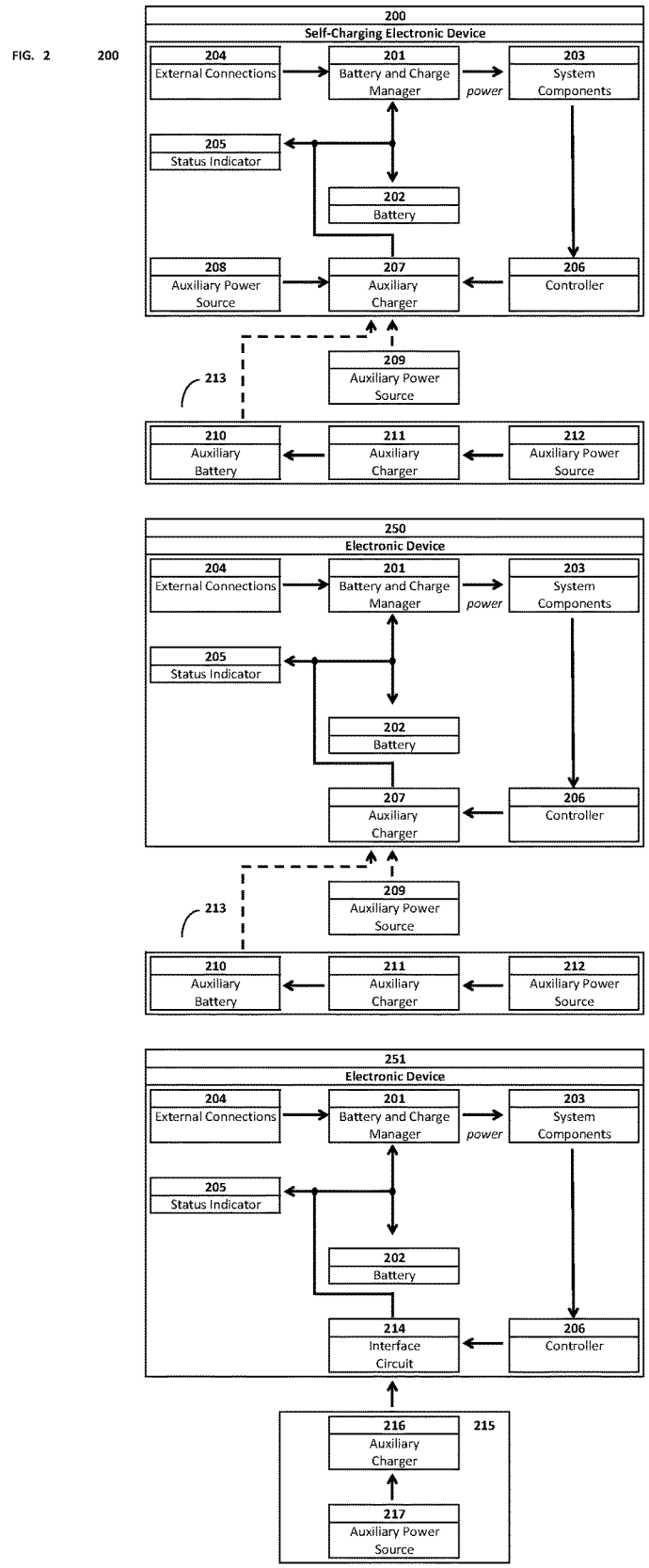
FIG. 2 is a schematic diagram of examples of self-charging electronic devices in accordance with the teachings of the present invention.

Referring to FIG. 2, in this embodiment, self-charging device 200 includes, battery charging manager 201 to manage power to be supplied to one or more system components 203. System components 203 can include major components of a self-charging electronic device mentioned above. When AC power is available, power manager 201 can draw power directly from the AC power (not shown) to provide power to system components 203. Meanwhile, power manager 201 can distribute a portion of the AC power to charge or recharge battery 202. When the AC power is not available, battery charging manager 201 can enable battery 202 to provide power to system components 203 for operations.

In addition, battery charging manager 201 can draw power from a variety of power sources to charge or recharge battery 202, which in turn can be used to provide power to system components 203 subsequently or substantially concurrently. According to certain embodiments of the invention, various power sources can include power provided from a communication line or media, such as, for example, a network connection 204 (e.g., Ethernet, a USB connection, or an IEEE 1394 compatible connection, a telephone line, or a combination of any of these power sources).

In addition, battery charging manager 201 can further draw power from an integral thermophotovoltaic power source 208 having one or more thermophotovoltaic cells or arrays, through auxiliary charger 207 and/or controller 206. In one embodiment, auxiliary charger 207 and controller 206 can be implemented using some or all of the techniques described above. According to one embodiment, battery charging manager 201 is configured to determine the statuses of various power sources 204 and 208, as well as other power sources 209 and/or 210 in alternative embodiments (and others not shown). Based on the statuses of the power sources, battery charging manger 201 can select one or more of the power sources, individually or substantially concurrently, to charge battery 202.

According to certain embodiments, various external power sources, such as power sources 204 can be coupled to self-charging electronic device 200 through one or more power interface circuits. Alternatively, these power sources can be coupled to self-charging electronic device 200 using a shared interface circuit with data connection, for example shared network connector, USB connector, IEEE 1394 connector, or a telephone jack, and the like.

In addition, controller 206 can communicate with one or more system components 203 to further enhance the thermophotovoltaic power charging techniques based on the operating environment or statuses of system components 203. Portable device 200 can include battery level indicator 205 for indicating a current battery level to a user. Other configurations can exist.

In embodiments in which electronic device 200 derives power from internal power source 208 and external power source 209, or in which power source 208 is not integrated within electronic device 200 (as shown in electronic device 250 in FIG. 2), external power source 209 can be non-fixedly coupled to auxiliary charger 207, such as through an interface (e.g., a connector or socket). In such embodiments, power source 209 can include a thermophotovoltaic panel having one or more thermophotovoltaic cells or arrays, and can be plugged into and removed from self-charging electronic device 200 or electronic device 250, for example, using a cable. Auxiliary charger 207 and/or controller 206 can further include plug and play capabilities to detect whether power source 209 is inserted or otherwise coupled and available to provide power and whether it is appropriate to use the power drawn from power source 209 to charge or recharge battery 202. Power source 209 in such uses can be manufactured by the same manufacturer of self-charging electronic device 200 or electronic device 250 or a third party.

In various embodiments, power package 213 includes a second auxiliary charger 211 and an auxiliary battery 210, while electronic device 200 maintains its first auxiliary charger 207. Power package 213 becomes a portable power package that can be plugged into electronic device 200 with an interface circuit (not shown), for example, with or without a cable.

In such embodiments, auxiliary battery 210 can be charged by the second auxiliary charger 211 using power derived from auxiliary power source 212 comprised of a thermophotovoltaic panel having one or more thermophotovoltaic cells or arrays. Auxiliary battery 210 can be charged while power package 213 is not coupled to device 200. The charged auxiliary battery 210 can then be used to charge or recharge battery 202 when power package 213 is coupled to device 200. Alternatively, when power package 213 is coupled to portable device 200, such as via NFMR or cable, auxiliary battery 210 can be charged by second auxiliary charger 211 using the thermophotovoltaic power derived from thermophotovoltaic power panel 212, while providing power to charge, via auxiliary charger 211, battery 202 substantially concurrently; likewise, in embodiments involving self-charging electronic device 200 (as compared to electronic device 250), auxiliary battery 210 can be charged by auxiliary charger 207 using thermophotovoltaic power derived from thermophotovoltaic power source 208 after battery 202 has been fully charged.

In embodiments in which thermophotovoltaic power source 217 and auxiliary charger 216 are implemented as a power package 215 external to electronic device 251. power package 215 becomes a portable power package that can be plugged into the device 251 via an interface circuit 214, for example, using a cable. Similarly, power package 215 can be manufactured by the same manufacturer of the portable device 251 or a third party.

Figure 3:
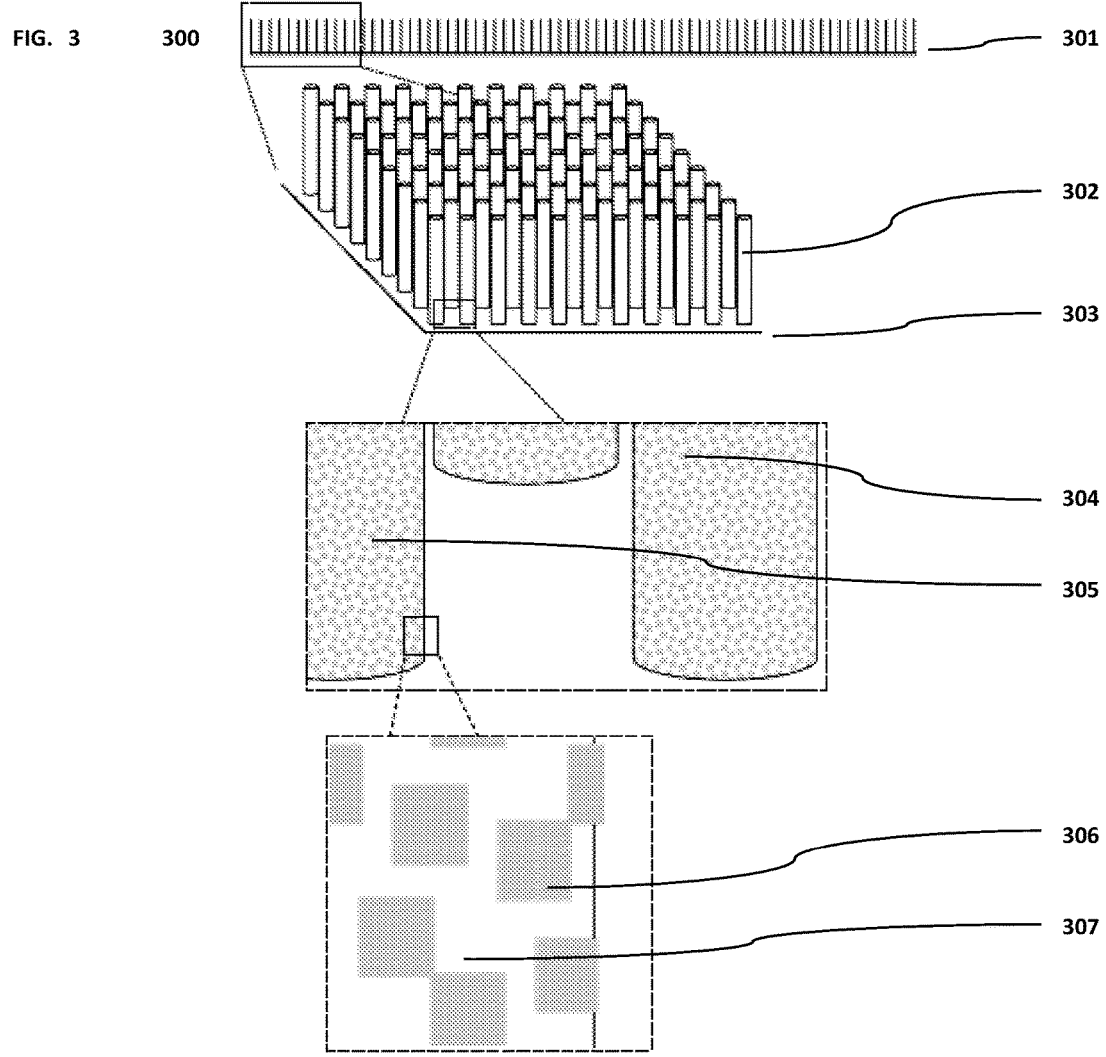
FIG. 3 is a series of diagrams illustrating an example thermophotovoltaic cell for use in converting thermal energy into electricity to provide power to self-charging electronic devices in accordance with the teachings of the present invention.

Referring to FIG. 3, in various embodiments of the invention, the glass exterior, microprocessor or other components (e.g., 201, 202 or 203 as shown in FIG. 2) of a self-charging electronic device is or are contiguous to or in communication with one or more aspects (e.g., 301) of thermophotovoltaic cell 300; wherein thermophotovoltaic cell 300 can at least in part be comprised of vertically-oriented, one-dimensional, monocrystalline, n-type nanowires 302 in communication with conductive substrate 303, and which are intercalated with a consortia of p-type quantum dots 306 tuned for absorption of infrared and other radiation.

Advantageously, quantum dots 306 absorb radiation and produce charges which are then separated rapidly across the nanometer-scale distances to the surface of nanowires 307, which then provide transport to underlying electrical contacts, for example that are in further communication with substrate 303, thereby reducing the recombination penalties and associated thermalization losses which plague conventional solar cells.

Further, thermal energy produced by or otherwise imparted to the components of the self-charging electronic device (e.g., 201, 202 and/or 203 of device 200 shown in FIG. 2) is emitted to and absorbed by the various aspects of thermophotovoltaic cell 300 (e.g., 301-307), which can then, in turn, emit infrared emissions within the high surface area basal plane of the nanowires, for example from nanowire 304 to nanowire 305 and vice versa, for absorption by quantum dots 306 and further charge production by thermophotovoltaic cell 300.

In this manner, thermalization upon exposure to radiation can be reduced in comparison to known devices (e.g., solar powered), and thermal energy from the components 201, 202 or 203) of an electric device, from the thermophotovoltaic cell, and/or from one or more sources external to the electronic device, becomes a valuable new source of electricity to power the electronic device; heat is not merely dissipated and lost as a form of waste in such uses, but rather recovered as it is converted to additional electrical energy. Other configurations exist, for example, in which alternative nanostructures or other substances having different compositions, structures, orientations and/or shapes are used in lieu of or in addition to nanowires 302 and/or quantum dots 306, for so long as the resulting thermophotovoltaic cell 300 of such alternative configurations converts at least a portion of the energy contained in the infrared radiation incident upon the thermophotovoltaic cell 300 into electrical energy.

Likewise, other configurations of electronic devices exist which incorporate one or more thermophotovoltaic cells 300 which produce thermophotovoltaic power upon absorption of thermal energy. Referring to FIG. 5, at least a portion of the absorbed thermal energy 501 derives from one or more components of exemplar electronic device 200, and at least a portion of the produced thermophotovoltaic power 502 is in turn used to provide power to operate electronic device 200. The thermophotovoltaic cells utilized in such and other embodiments may, for example, be designed to be contiguous to and surround a particular component given its thermal energy output, such as microprocessor 503 and thermophotovoltaic array 504. The thermophotovoltaic array 504 in such an example can absorb thermal energy emissions by conduction 506 and convection 507 in addition to radiation 505, and from one or more sources external to host electronic device, such as the sun 508, the host device 509, the local environment 510, and/or the user 511 of the host electronic device. Other configurations exist.

The ability to recover and use a portion of the thermal energy released by an electronic device to provide power to operate that electronic device is essential to embodiments of the invention involving self-charging electronic devices, such as self-charging electronic device 200 or 512. In such embodiments, the electronic device (e.g., 512), is comprised at least in part of one or more components 513 which require electricity to function, and one or more thermophotovoltaic cells 514 which produce electricity upon absorption of thermal energy 515, at least a portion which derives from one or more components of self-charging electronic device 512 (e.g., 512, 513, and/or 514); wherein at least a portion of produced electricity 517 is produced by converting at least a portion of the energy contained in the infrared radiation emissions (e.g., 515 from 513) incident upon one or more thermophotovoltaic cells 514 into electrical energy; and, wherein at least a portion of produced electricity 517 is used to operate one or more components of the self-charging electronic device (e.g., 512 or 513).

Myriad electronic devices exist which could incorporate the ability to provide themselves a portion of the power they require to operate, such as devices selected from a group consisting of: a computer; a media player; a cellular phone; a smartphone; an internet-capable device; a personal digital assistant; an image capture or processing device; a handheld or other portable computing device; a light emitting diode or other lighting device; a watch, garment or other wearable device; a pacemaker or other implanted or medical device;

a transformer or other electrical component; an alternator; a surge protector; a conventional solar powered device; a battery; and, an electric vehicle.

Figure 4:
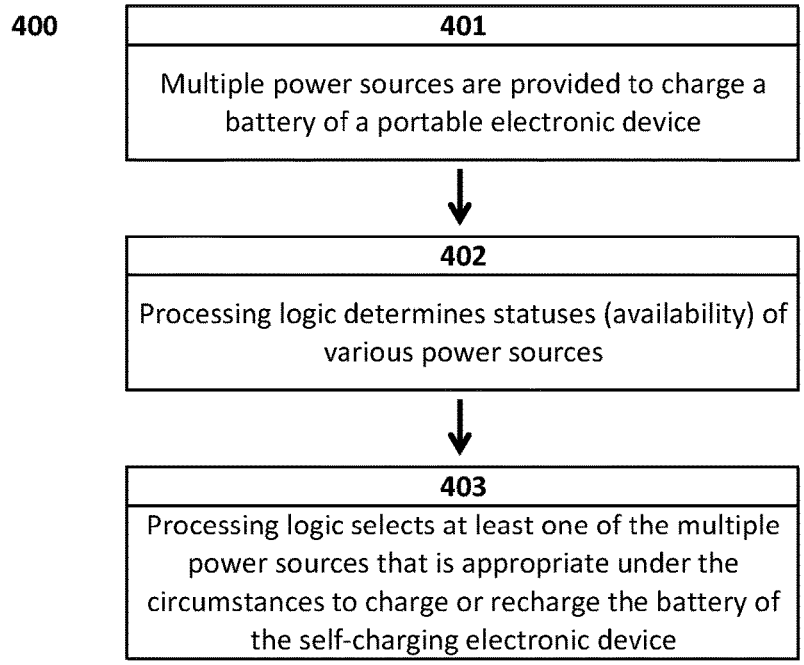
FIG. 4 is a flow diagram illustrating an example of a process for interfacing a self-charging electronic device with a variety of power sources in accordance with the teachings of the present invention.

FIG. 4 is a flow diagram illustrating an example of a process for interfacing a self-charging electronic device with a variety of power sources according to one embodiment of the invention. Exemplary process 400 can be performed by a processing logic that can include hardware (circuitry, dedicated logic, and the like), software (such as is run on a dedicated machine), or a combination of both. For example, process 400 can be performed by systems as shown in FIG. 2. In one embodiment, process 400 includes, but is not limited to, determining statuses of a plurality of power sources available to the electronic device, where the plurality of power sources includes a thermophotovoltaic power source, and selecting one of the plurality of power sources to charge a battery of the electronic device, including selecting the thermophotovoltaic power source when an operating environment is appropriate.

Referring to FIG. 4, at block 401, multiple power sources, such as thermophotovoltaic power, power received from a network connection, USB connection, an IEEE 1394, a telephone line, or wireless charger, are provided to charge a battery of a self-charging electronic device. At block 4092, processing logic determines statuses, for example availability of the various power sources. In response to a given operating environment of the portable electronic device, at block 403, processing logic selects at least one of the multiple power sources that is appropriate under the circumstances to charge or recharge the battery of the portable electronic device. Other operations can also be performed.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A thermophotovoltaic power package for use with an electronic device, the package comprising:

one or more thermophotovoltaic cells operable to derive thermophotovoltaic power from thermal energy, the thermophotovoltaic cells comprising vertically-oriented anatase nanowires in communication with a substrate; and a power charger operable to provide the derived thermophotovoltaic power to the electronic device, wherein the derived thermophotovoltaic power is provided in a plug-and-play fashion when the electronic device is coupled to the package, and wherein the power charger is operative to adjust the amount of power provided to the electronic device based on attributes of the electronic device.

2. The thermophotovoltaic power package of claim 1, wherein the power charger is further operable to provide the derived thermophotovoltaic power to the electronic device by charging a battery of the electronic device.

3. The thermophotovoltaic power package of claim 1, further comprising an accessory battery, wherein:

the power charger is further operable to charge the accessory battery with the derived thermophotovoltaic power; and the accessory battery is operable to provide the derived thermophotovoltaic power to the electronic device.

4. The thermophotovoltaic power package of claim 1, further comprising an accessory battery and wherein the power charger is further operable to concurrently:

provide a first portion of the derived thermophotovoltaic power to the electronic device; and charge the accessory battery with a second portion of the derived thermophotovoltaic power.

5. The thermophotovoltaic power package of claim 1, wherein one or more thermophotovoltaic cells are removable from the thermophotovoltaic power package.

6. The thermophotovoltaic power package of claim 1, wherein the thermophotovoltaic power package is capable of being plugged into and removed from the electronic device.

7. The thermophotovoltaic power package of claim 1, wherein the power charger is further operable to be enabled to provide the derived thermophotovoltaic power to the electronic device based on the status of the package.

* * * * *